(12) United States Patent
Hsu et al.

(10) Patent No.: US 7,297,602 B2
(45) Date of Patent: Nov. 20, 2007

(54) CONDUCTIVE METAL OXIDE GATE FERROELECTRIC MEMORY TRANSISTOR

(75) Inventors: Sheng Teng Hsu, Camas, WA (US); Tingkai Li, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/659,547

(22) Filed: Sep. 9, 2003

(65) Prior Publication Data

US 2005/0054166 A1    Mar. 10, 2005

(51) Int. Cl.
*H01L 21/331* (2006.01)
*H01L 21/335* (2006.01)

(52) U.S. Cl. .................... 438/287; 438/3; 438/197

(58) Field of Classification Search ............ 438/3, 438/197, 287
See application file for complete search history.

(56) References Cited

U.S. PATENT DOCUMENTS

| | | | |
|---|---|---|---|
| 3,832,700 A | 8/1974 | Wu et al. | |
| 5,293,510 A * | 3/1994 | Takenaka | .................... 257/295 |
| 5,303,182 A | 4/1994 | Nakao et al. | |
| 5,365,094 A | 11/1994 | Takasu | |
| 5,383,088 A | 1/1995 | Chapple-Sokol et al. | |
| 5,418,389 A * | 5/1995 | Watanabe | .................... 257/295 |
| 5,621,681 A | 4/1997 | Moon | |
| 5,731,608 A | 3/1998 | Hsu et al. | |
| 5,744,374 A * | 4/1998 | Moon | .................... 438/3 |
| 5,777,356 A | 7/1998 | Dhote et al. | |
| 5,798,903 A | 8/1998 | Dhote et al. | |
| 5,812,442 A | 9/1998 | Yoo | |
| 5,932,904 A | 8/1999 | Hsu et al. | |
| 5,942,776 A | 8/1999 | Hsu et al. | |
| 5,962,884 A | 10/1999 | Hsu et al. | |
| 6,011,285 A | 1/2000 | Hsu et al. | |
| 6,018,171 A | 1/2000 | Hsu et al. | |
| 6,069,381 A | 5/2000 | Black et al. | |
| 6,117,691 A | 9/2000 | Hsu et al. | |
| 6,140,173 A | 10/2000 | Wolters et al. | |
| 6,146,904 A | 11/2000 | Hsu et al. | |
| 6,151,240 A | 11/2000 | Suzuki | |
| 6,214,724 B1 | 4/2001 | Nakajima | |
| 6,225,655 B1 | 5/2001 | Moise et al. | |
| 6,362,499 B1 | 3/2002 | Moise et al. | |
| 6,420,742 B1 | 7/2002 | Ahn et al. | |
| 6,498,362 B1 | 12/2002 | Forbes et al. | |
| 6,503,763 B2 | 1/2003 | Li et al. | |
| 6,531,325 B1 | 3/2003 | Hsu et al. | |
| 6,538,273 B2 * | 3/2003 | Willer et al. | .................... 257/295 |

(Continued)

*Primary Examiner*—Zandra V. Smith
*Assistant Examiner*—Pamela E Perkins
(74) *Attorney, Agent, or Firm*—Law Office of Gerald Maliszewski; Gerald Maliszewski

(57) ABSTRACT

The present invention discloses a ferroelectric transistor having a conductive oxide in the place of the gate dielectric. The conductive oxide gate ferroelectric transistor can have a three-layer metal/ferroelectric/metal or a two-layer metal/ferroelectric on top of the conductive oxide gate. By replacing the gate dielectric with a conductive oxide, the bottom gate of the ferroelectric layer is conductive through the conductive oxide to the silicon substrate, thus minimizing the floating gate effect. The memory retention degradation related to the leakage current associated with the charges trapped within the floating gate is eliminated. The fabrication of the ferroelectric transistor by a gate etching process or a replacement gate process is also disclosed.

17 Claims, 13 Drawing Sheets

U.S. PATENT DOCUMENTS 6,548,342 B1 * 4/2003 Suzuki et al. ............... 438/240
6,674,110 B2 * 1/2004 Gnadinger ................. 257/295
2003/0067022 A1 * 4/2003 Sakai et al. ................. 257/295

* cited by examiner

CONDUCTIVE METAL OXIDE GATE FERROELECTRIC MEMORY TRANSISTOR

FIELD OF THE INVENTION

This invention related generally to semiconductor device and nonvolatile memory transistor, and more particularly to ferroelectric gate transistor structures and methods of fabrication.

BACKGROUND OF THE INVENTION

Ferroelectric materials are composed of many randomly-distributed permanently polarized regions. When an electric field is applied, the regions with a polarization component in the direction of the electric field grow at the expense of the non-aligned regions so that a net polarization can result. If the electric field decreases, the polarization also decreases but at a slower rate so that even when the electric field becomes zero, a remnant polarization remains. A negative coercive field is required to bring the polarization to zero. This hysteresis behavior of a ferroelectric material is the basis of ferroelectric nonvolatile memory devices.

Currently there are two types of ferroelectric nonvolatile memory devices: ferroelectric capacitor which uses a transistor to detect the polarization of a ferroelectric capacitor, and ferroelectric transistor which detects a change in the transistor conductance caused by the polarization of a ferroelectric gate material. The ferroelectric transistor is much more advantageous than the ferroelectric capacitor due to the smaller surface area thus enabling higher density memory chip, and the non-destructive readout, thus significantly reducing the fatigue problem.

The ferroelectric transistor is typically a ferroelectric-gate-controlled semiconductor field-effect transistor (FET), which employs a ferroelectric film in the gate stack of the FET, and in which a proper polarization of the ferroelectric film can create an inversion layer in a channel region of the transistor. The basic ferroelectric-gate controlled field-effect transistor is a metal-ferroelectric silicon (MFS) FET. The term MFS represents the layers in the gate stack of the ferroelectric transistor. Thus the gate stack of the MFS transistor consists of a metal (M) gate electrode disposed on a ferroelectric (F) gate dielectric on the silicon (S) channel of the transistor. FIG. 1 shows the schematic of an n-channel MFS transistor. A ferroelectric film 12 is formed as a gate insulating film on a p-type silicon substrate 13, together with source 14 and drain 15 regions having a high concentration of n-type impurity ions. A metal gate electrode 11 is formed over the ferroelectric film 12. The MFS transistor is isolated by the isolation trenches 16.

However, effective transistor operation of the above MFS transistor is difficult to achieve due to the requirement of the ferroelectric/silicon interface. When a ferroelectric film is deposited directly on the silicon substrate, metals and oxygen from the ferroelectric layer may diffuse into the ferroelectric-silicon interface, creating interface trap charges, affecting the polarization of the ferroelectric film, and overall may make the operation of the ferroelectric transistor becoming unstable. Further, since the thermal expansion coefficient and lattice structure of a ferroelectric film is not compatible with silicon, it is very difficult to form a high-quality ferroelectric film with a clean interface directly on the silicon substrate.

To address the drawbacks posed by the direct ferroelectric/silicon interface, a gate dielectric and a floating metal gate can be inserted between the ferroelectric film and the silicon substrate. The ferroelectric transistor is then called metal-ferroelectric-oxide (or insulator) silicon (MFOS or MFIS) FET or metal-ferroelectric-metal-oxide (or insulator) silicon (MFMOS or MFMIS) FET. FIG. 2A shows a MFOS memory transistor using a gate oxide layer 27 formed between the silicon substrate 13 and the ferroelectric film 12. Alternatively, a metal floating gate layer 28 can be added between the ferroelectric film 12 and the gate oxide layer 27 as shown in FIG. 2B for a MFMOS transistor. A suitable conducting material (e.g. Pt or Ir) is normally selected for the floating gate 28 to allow the deposition of the ferroelectric thin film and to prevent diffusion of the ferroelectric material into the gate dielectric and the channel. The floating gate layer 28 is also called bottom electrode, or bottom gate, in reference to the other gate electrode 11, called top electrode, or top gate.

Such gate stack structures (metal-ferroelectric-oxide gate stack or metal-ferroelectric-metal-oxide gate stack) overcome the surface interface and surface state issues of a ferroelectric layer in contact with the silicon substrate. However, they incorporate other difficulties such as higher operation voltage and trapped charges in the bottom floating gate layer. The operation voltage of these transistors is higher than the ferroelectric layer programming voltage by an amount of the voltage across the gate dielectric. And when there is a voltage applied across the ferroelectric thin film, there will be current flow in the gate stack, and charges would be trapped in this floating electrode. The trapped charges may neutralize the polarization charges at the interface of the bottom electrode and the ferroelectric film and could shorten the memory retention time of this structure.

The present invention addresses both the higher operation voltage and the trapped charge issues in the ferroelectric memory transistor and discloses an improved ferroelectric memory transistor structure and fabrication methods.

Various prior designs have been disclosed to compensate for the trapped charges in the floating bottom electrode. Black et al., U.S. Pat. No. 6,069,381, entitled "Ferroelectric memory transistor with resistively coupled floating gate" discloses a resistor between the bottom floating gate electrode and the source/drain to remove the trapped charges. This additional resistor ensures that the potential of the floating gate will approach that of the source/drain region after a certain delay time, but this could affect the high speed switching characteristics of the ferroelectric memory. Yoo, U.S. Pat. No. 5,812,442, entitled "Ferroelectric memory using leakage current and multi-numerical system ferroelectric memory" discloses a leakage gate dielectric to remove the trapped charges. The leakage current is generated by a Schottky emission or a Frankel-Poole emission or Fowler-Nordheim tunneling to reduce the bound charges in the bottom metal electrode. In either designs, the higher operation voltage issue still remains due to the presence of the gate dielectric.

Another prior art design to reduce the trapped charges in the lower electrode is the formation of a Schottky diode such as a metal-ferroelectric-metal silicon (MFMS) device disclosed in Nakao et al., U.S. Pat. No. 5,303,182, entitled "Nonvolatile semiconductor memory utilizing a ferroelectric film". A Schottky barrier is formed between the bottom metal electrode of the gate unit (or a very shallow junction layer) and the silicon substrate. The Schottky ferroelectric gate memory transistor requires a space between the bottom electrode and the source and drain region or a very shallow n-channel under the gate, therefore the drive current of the Schottky ferroelectric gate memory transistor can be relatively low. Hsu et al., U.S. Pat. No. 5,731,608, entittled "One transistor ferroelectric memory cell and method of making the same", and its continuations and divisions (U.S. Pat. Nos. 5,962,884; 6,117,691; 6,018,171; 5,942,776; 5,932,904; 6,146,904; 6,011,285; 6,531,325), hereby incorporated by reference, disclose a distance between 50 to 300 nm between the bottom metal electrode to the source and drain to reduce the possible high leakage current due to the increased field intensity at the metal edge of the Schottky diode because of the sharp edge at the periphery of the metal contact. Alternatively, Willer et al., U.S. Pat. No. 6,538,273, entittled "Ferroelectric transistor and method for fabricating it", discloses a recess of the source and drain below the surface of the semiconductor surface in a Schottky ferroelectric gate memory transistor.

SUMMARY OF THE INVENTION

The present invention discloses a ferroelectric transistor having a conductive oxide in the place of the gate dielectric. By replacing the gate dielectric with a conductive oxide, the bottom gate of the ferroelectric layer is conductive through the conductive oxide to the silicon substrate, therefore there is no floating gate effect. The memory retention degradation related to the leakage current associated with the charges trapped within the floating gate is eliminated. Furthermore, the operating voltage for the ferroelectric transistor can be reduced to the ferroelectric layer programming voltage because of the absence of the gate dielectric.

The present invention ferroelectric transistor can be a metal-ferroelectric-metal-conductive oxide silicon (MFMCS) FET. The gate stack of the MFMCS transistor has a top metal electrode (or top gate) disposed on a ferroelectric layer disposed on a bottom metal electrode (or bottom gate) disposed on a conductive oxide layer on the silicon substrate.

The present invention ferroelectric transistor can also be a metal-ferroelectric-conductive oxide silicon (MFCS) FET. The gate stack of the MFCS transistor has a top metal electrode (or top gate) disposed on a ferroelectric layer disposed on a conductive oxide layer on the silicon substrate.

The conductive oxide further can have the advantages of possible lattice matching with the ferroelectric layer, reducing or eliminating the oxygen diffusion problem at the ferroelectric interface to improve the reliability of the ferroelectric transistor, and possible etch selectivity improving with other dielectric and metal films.

The fabrication process of the present invention ferroelectric transistor can be performed by with a gate etching process or a replacement gate process. In the gate etching process, the multilayer gate stack is deposited and etched, while in the replacement gate process, a replacement gate stack is deposited as a place holder for the fabrication of other portions of the device, then the replacement gate stack is removed and the functional gate stack is deposited.

DETAILED DESCRIPTION OF THE INVENTION

The ferroelectric transistor of the present invention is a ferroelectric field effect transistor having a conductive oxide layer replacing the gate dielectric. Thus the present invention ferroelectric transistor is called a conductive oxide gate ferroelectric transistor, and is preferably used in nonvolatile memory applications.

Figure 1:
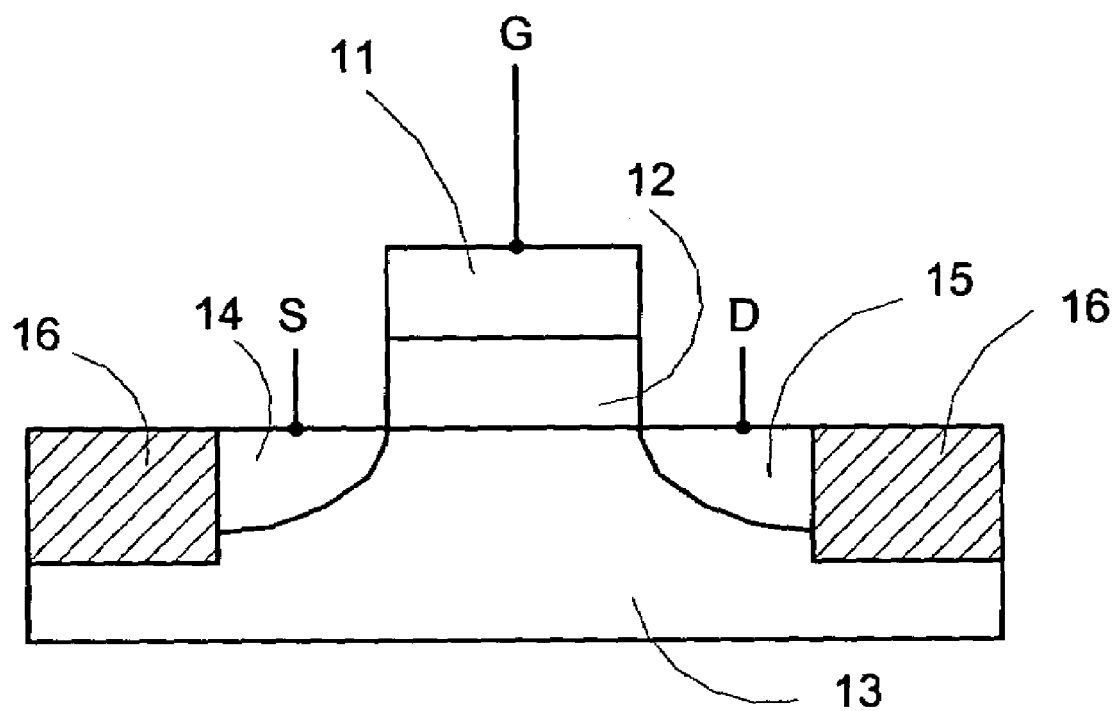
FIG. 1 shows a typically ferroelectric-gate-controlled semiconductor field-effect transistor (FET) which is a metal-ferroelectric silicon (MFS) FET.
Figure 2A:
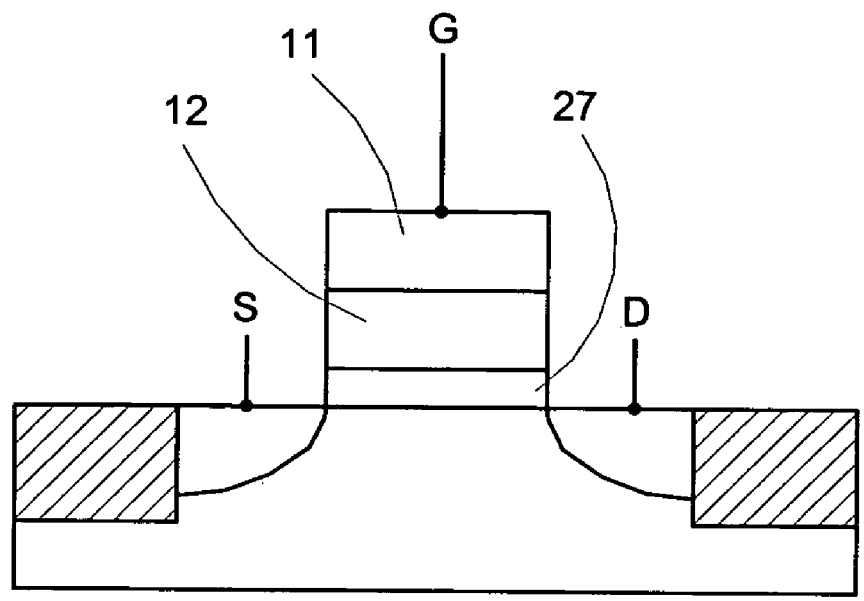
FIG. 2A shows a schematic of a metal-ferroelectric-oxide silicon MFOS transistor.
Figure 2B:
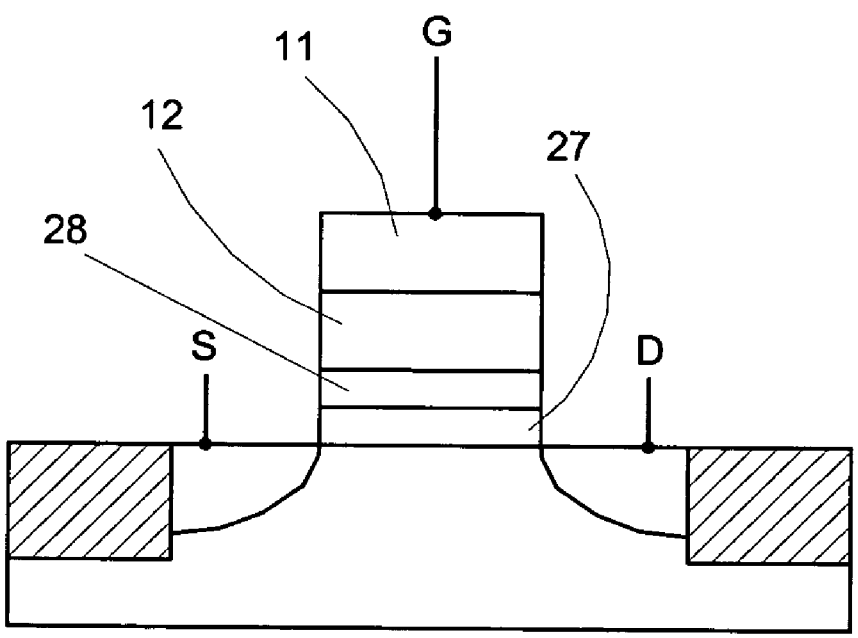
FIG. 2B shows a schematic of a metal-ferroelectric-metal-oxide silicon MFMOS transistor.
Figure 3:
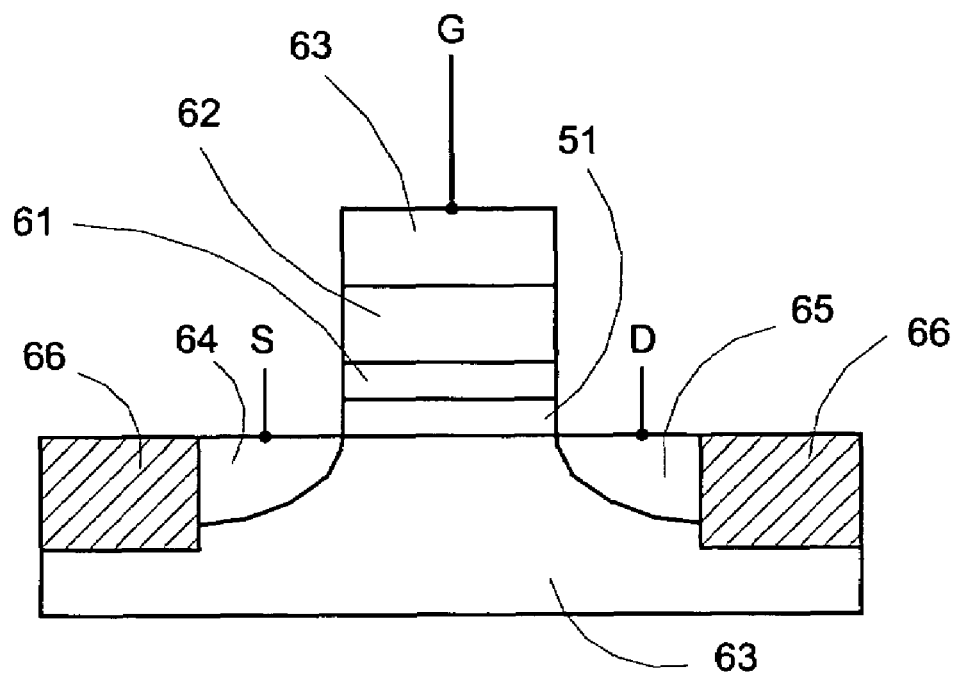
FIG. 3 shows a schematic of the present invention conductive oxide ferroelectric transistor.

The first embodiment of the present invention is shown in FIG. 3, illustrating an n-channel conductive oxide gate ferroelectric transistor. The gate stack of the present invention comprises a top gate electrode 63, a ferroelectric film 62, a bottom gate electrode 61 and a conductive oxide gate 51, positioning on a p-type silicon substrate 63, and disposed between the source 64 and drain 65 regions having a high concentration of n-type impurity ions. The ferroelectric transistor is isolated by the isolation trenches 66. The gate insulator of the present invention transistor is replaced with a conductive oxide such as $InO_2$ or $RuO_2$ to prevent floating gate effect.

Figure 4A:
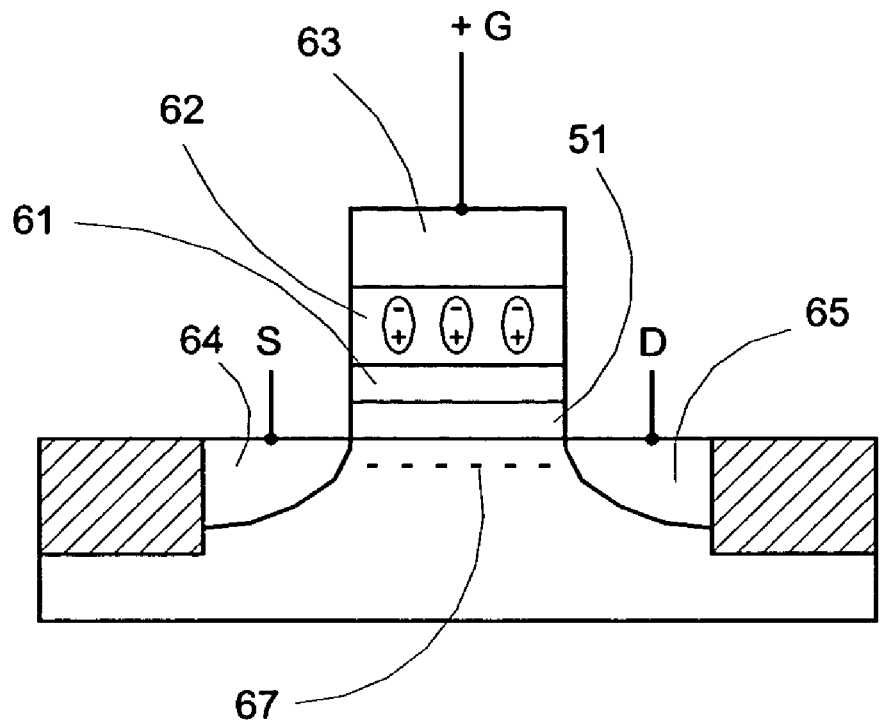
FIGS. 4A-B show the operation of the present invention conductive oxide ferroelectric transistor.

FIG. 4 show the operation of the above n-channel conductive oxide ferroelectric transistor. In FIG. 4A, when a positive voltage is applied to the gate electrode 63, polarization of the ferroelectric film 62 occurs with electrons are pulled to the top and holes are pulled to the bottom of the ferroelectric film. Electrons are then accumulated at the conductive oxide and the surface of the silicon under the ferroelectric gate stack. This forms a high conductive channel 67. Therefore the ferroelectric transistor is "ON", i.e. if a voltage bias is placed across the source 64 and the drain 65, a current will flow through the transistor. The ferroelectric transistor memory is nonvolatile, meaning that the transistor remains in the ON state even after this positive voltage is removed due to the remnant polarization of the ferroelectric film 62.

Figure 4B:
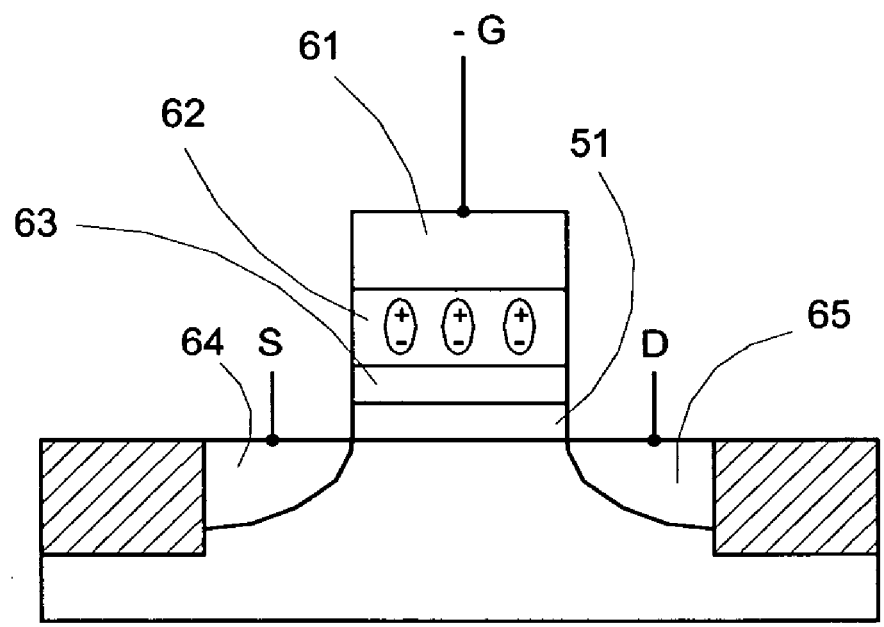

In FIG. 4B, when a negative voltage is applied to the gate electrode 61, opposite polarization occurs in the ferroelectric film 62 with holes are pulled to the top of the ferroelectric gate and electrons are pulled to the bottom of the ferroelectric film. Holes then are accumulated at the conductive oxide and the surface of the silicon under the ferroelectric gate stack. There are no conduction channel 67, and the ferroelectric transistor is "OFF", i.e. a non-conduction state takes place between the source 64 and drain 65 regions, which is maintained even after the negative voltage is removed.

The conductive oxide prevents the bottom electrode 61 from direct contact to the n+ source and drain junctions. Since the bottom electrode 61 is connected to the silicon through the conductive oxide 51, the bottom electrode 61 is not electrically isolated, therefore would not be able to accumulate charges likes a floating gate. The charge retention time of this device is thus independent of the current flow through the ferroelectric thin film.

Figure 5:
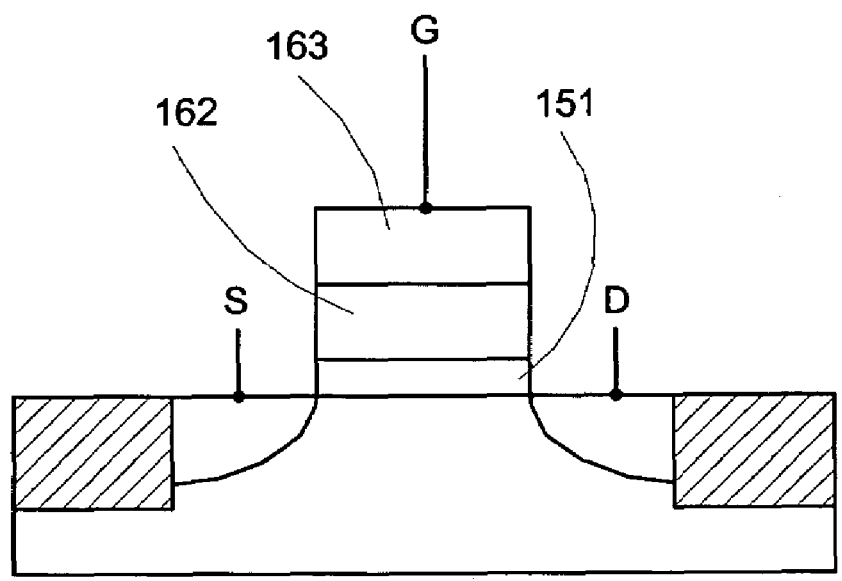
FIG. 5 shows another embodiment of the present invention conductive oxide ferroelectric transistor.

In the second embodiment of the invention, the bottom gate electrode is omitted. Thus gate stack of the conductive oxide gate ferroelectric transistor comprises a top gate electrode 163, a ferroelectric film 162, and a conductive oxide gate 151 as shown in FIG. 5.

The conductive oxide in the present invention is preferably a conductive metal oxide, but can be a conductive oxide without any metal components. The conductive oxide can make good interface with the silicon substrate, and can be selected to have a good lattice matching with the deposited ferroelectric film, especially ones having perovskite crystal structures.

Furthermore, a conductive oxide serving as electrodes for the ferroelectric film may improve the quality of the ferroelectric film, and thus the operation of the ferroelectric transistor. A ferroelectric film is generally formed in an oxidizing ambience such as a deposition process with oxygen as a reactive gas, or an annealing process in an oxygen ambience to improve the stability of the deposited ferroelectric film. Therefore the electrode material for a ferroelectric film is preferable an oxidization resistant noble metal such as Pt and Ir. Conductive oxides is already oxidation resistant, and further, due to the high concentration of oxygen, the conductive oxide film can suppress the movement and accumulation of oxygen at the ferroelectric/conductive oxide interface to improve the reliability such as fatigue and the controllability of the ferroelectric and therefore its polarization property.

One further advantage of conductive metal oxide is the etch selectivity. Oxygen can be used as an etching gas for conductive metal oxides since a steam pressure of metal oxide is typically very high. The conductive metal oxide therefore can be etched with high selective etching rate to other dielectric films. In addition, the conductive metal oxide and the metal can have high selective etching rate since the conductive metal oxide films ($RuO_2$, for example) normally cannot easily react with halogen such as F and Cl used for etching the metal films.

The conductive metal oxide film is preferably an oxide film of any one metal selected from a group of Mo, W, Tc, Re, Ru, Os, Rh, Ir, Pd, Pt, In, Zn, Sn, Sr—Ru or Sr—Co (such as $IrO_2$ and $RuO_2$), or a rock-salt (NaCl) crystal structure face-centered cubic metal oxide, such as NdO, NbO, SmO, LaO, and VO. The preferred method of forming the conductive oxide is by deposition. However, other methods may be used such as doping by diffusion and ion implantation. For example, the conductive oxide can be boron (B) doped or fluorine (F) doped ZnO and antimony (Sb) doped or fluorine (F) doped $SnO_2$.

The conductive oxide may be composed of any number of conductive perovskite oxides such as lanthanum strontium cobalt oxide (LSCO). Typical examples of simple perovskite oxides are expressed by the general formula $ABO_3$ such as $SrRuO_3$ or $LaNiO_3$, where AB can be any combination of (A=Ca, Sr)(B=V, Cr, Fe, Ru), (A=La)(B=Ti, Co, Ni, Cu), (A=H, Li, Na, K)(B=Re, Mo, Nb), (A=$La_{1-x}Sr_x$)(B=V, Mn, Co). Another example of conductive perovskite oxides is expressed by the general formula $A_2B_2O_7$ where (A=Bi, Pd)(B=$Ru_{1-x}Bi_x$, $Ru_{1-x}Pb_x$). Examples of layered perovskite oxides include $CaTiO$, $(Sr(Ru, Ir, Cr)O_3)(SrO)_n$ such as $SrRuO_3$, $SrIrO_3$, $Sr_2RuO_4$, $Sr_2IrO_4$ and $Ba_2RuO_4$. The conductive oxide film can also include high temperature superconducting oxides such as $La_{1-x}Sr_xCuO_4$, $Nd_{1-x}Ce_xCuO_4$, $YBa_2Cu_3O_7$, $Bi_2Sr_2Ca_{n-1}Cu_{Cex})_2CuO_4$. See, for example, Suzuki, U.S. Pat. No. 6,151,240, entitled "Ferroelectric nonvolatile memory and oxide multi-layered structure", hereby incorporated by reference.

The ferroelectric material disclosed in the present invention is preferably any of the following: $Pb(Zr, Ti)O_3$ (PZT), $SrBi_2Ta_2O_9$ (SBT), $Pb5Ge_3O_{11}$ (PGO), $BaTiO_3$, or $LiNbO_3$, but any ferroelectric material exhibiting hysteresis effect can be employed in the conductive oxide ferroelectric transistor. The preferred ferroelectric compounds are, in order of preference, PGO, SBT and PZT.

The bottom electrode and the top electrode are preferably a metal layer such as aluminum, platinum or iridium, and more preferably a conductive layer, a conductive oxide layer, a conductive metal oxide layer, or a multilayer such as conductive oxide/metal, or conductive metal oxide/metal.

Within the scope of the invention, the disclosed conductive oxide ferroelectric transistor structure may also incorporate all the advanced features of the state of the art technology such as SOI or SIMOX substrate, halo or LDD source and drain, sidewall spacers for the gate stack, shallow trench isolation (STI) or LOCOS isolation, silicide formation such as titanium silicide, cobalt silicide, or nickel silicide, raised source and drain, passivation, tungsten or aluminum contact, aluminum or copper metallization.

The present invention further discloses the fabrication process for the conductive oxide ferroelectric transistor. Although the fabrication process for the conductive oxide ferroelectric transistor is illustrated and described below with reference to certain specific processes, the present invention is nevertheless not intended to be limited to the details shown. The general process of semiconductor fabrication has been practiced for many years, and due to the multitude of different ways of fabricating a device or structure, various modifications may be made in the fabrication process details within the scope and range of the present invention and without departing from the meaning of the invention.

One fabrication process for the conductive oxide ferroelectric transistor is a gate etching process, employing an etching process to form the gate stack and comprising the steps of:

Preparing a semiconductor substrate

Forming a gate stack on the substrate

Forming drain and source regions on opposite sides of the gate stack.

The device fabrication process is then completed with passivation and interconnect metallization steps.

Figure 6A:
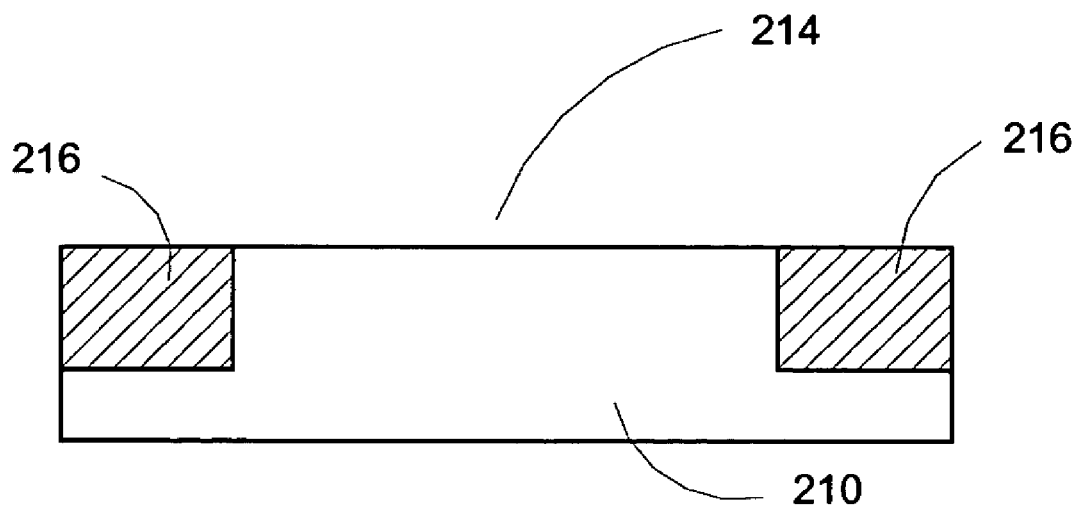
FIGS. 6A-F show a representative fabrication process for gate etching process.

Preparing a Semiconductor Substrate, FIG. 6A:

The fabrication process starts with a substrate (p-type or n-type, bulk or silicon-on-insulator, SOI or SIMOX) and any state of the art suitable processes for the well formation and device isolation. FIG. 6A shows a p-type substrate 210 (similar fabrication process can be applied to an n-type substrate with appropriate corrections and adjustments) and shallow trench isolation (STI) 216 to form an active device area 214. For simplicity, important but unrelated details is not shown, such as periphery devices, well formation process and active region threshold voltage adjustment.

Figure 6B:
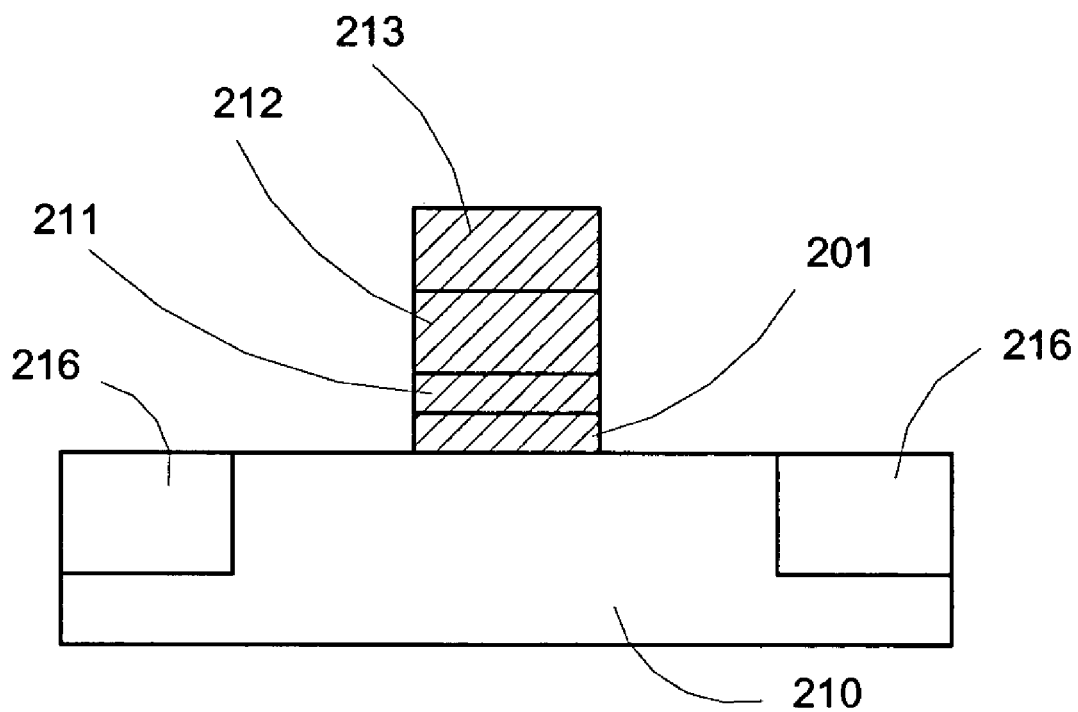

Forming a Gate Stack on the Substrate, FIG. 6B:

Then the gate stack multilayer of conductive oxide/bottom electrode/ferroelectric film/top electrode is deposited. In the second embodiment of the invention, the bottom electrode is omitted, and the gate stack multilayer comprises only of three layers: conductive oxide, ferroelectric film, and top electrode. The conductive oxide is perferably between 10 to 30 nm thick and is preferably $InO_2$ or $RuO_2$, but can be any conductive oxide materials as disclosed above. The bottom electrode is perferably between 50 to 200 nm thick and is perferably platinum or iridium, but also can be any conductive metal or conductive oxide materials. The ferroelectric layer is perferably between 50 to 300 nm thick and is perferably PGO, BST or PZT, but can be any ferroelectric material exhibiting hysteresis effect. The top electrode is perferably between 50 to 200 nm thick and is perferably aluminum, platinum or iridium, but also can be any conductive metal or conductive oxide materials. Furthermore, the electrode layers (either the bottom or the top electrode) can be a multilayer of metal and conductive oxide.

The gate stack multilayer is then patterned into a ferroelectric gate stack, comprising a top electrode 213, a ferroelectric 212, a bottom electrode 211, and a conductive oxide 201 as shown in FIG. 6B. The patterning of the gate stack multilayer is preferably by photolithography where a patterned mask is provided on the gate stack multilayer, then the gate stack multilayer is etched according to the pattern mask, and then the patterned mask is removed. The patterned mask is preferably a photoresist layer, coated and exposed to UV light under a photo mask to transfer a pattern from the photo mask onto the photoresist. The photoresist mask protects the gate stack multilayer during an etch step to transfer the pattern from the photoresist onto the gate stack multilayer. And then the photoresist mask can be stripped. The gate stack multilayer etching is preferably accomplished by reactive ion etching or by wet etches.

Figure 6C:
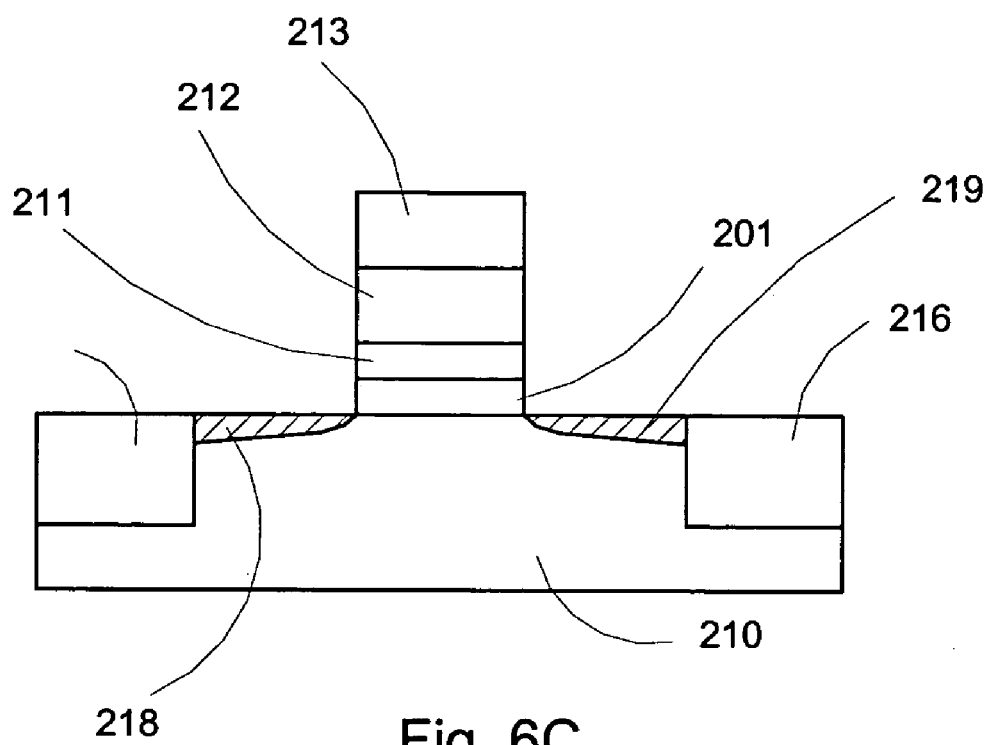

The next step is low doping drain (LDD) ion implantation into source 218 and drain 219 regions, although the ferroelectric memory transistor may or may not requires this LDD ion implantation. LDD implantation includes implantation of phosphorus ions at an energy level of 15 keV to 40 keV, or arsenic ions at an energy level of 30 keV to 60 keV. The doses of the LDD phosphorus or arsenic implantation are about $5\times10^{14}$ cm$^{-2}$ to $10^{15}$ cm$^{-2}$ (FIG. 6C), though the specific energy and dose values can be adjusted for optimizing the ferroelectric transistor operation.

Figure 6D:
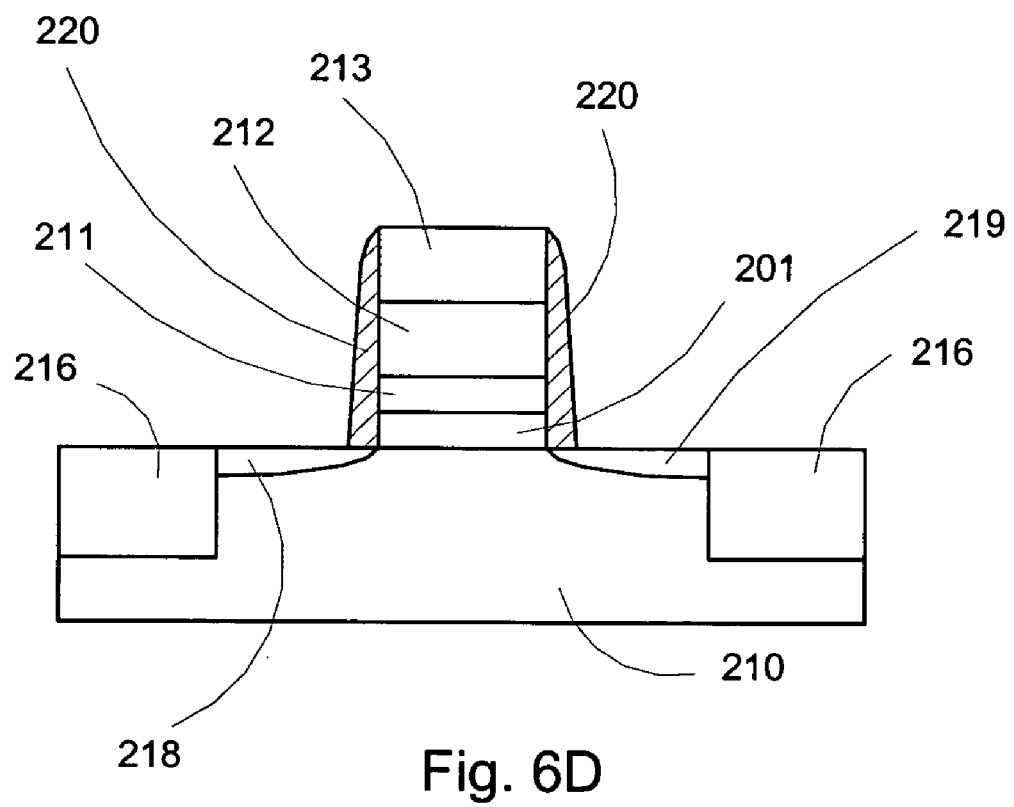

The next step is sidewall spacer formation. A layer of dielectric material such as silicon nitride or silicon dioxide is deposited onto the gate stack to a thickness of about between 20 to 80 nm, and then is anisotropic etched to leave a dielectric sidewall spacer 220 on the ferroelectric gate stack (FIG. 6D).

Figure 6E:
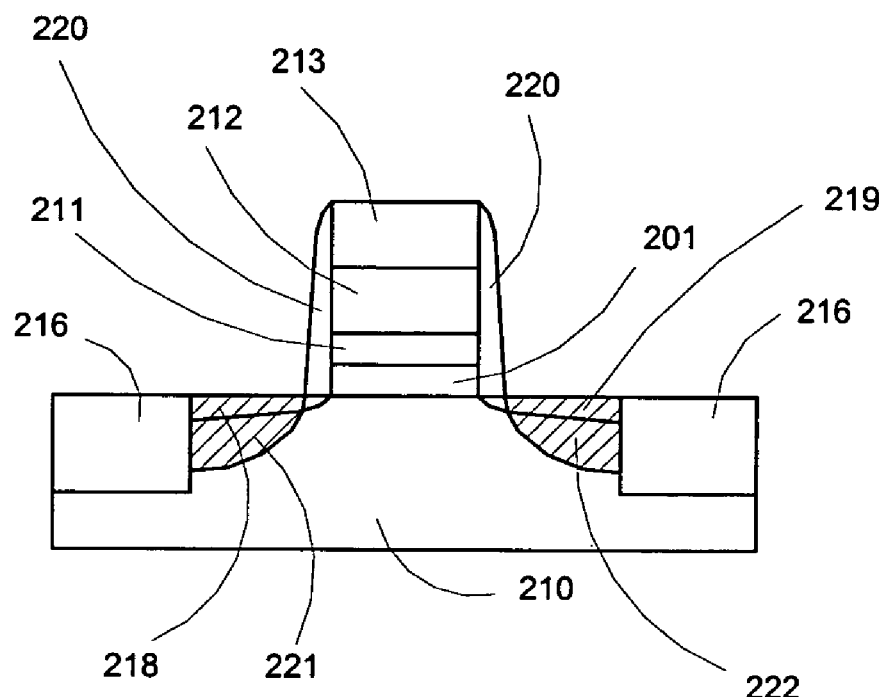

Forming Drain and Source Regions on Opposite Sides of the Gate Stack, FIG. 6E.

Then a source region 221 and a drain region 222 are formed by implantation of doping ions, for example arsenic at a dose of about $10^{15}$ cm$^{-2}$ to $5\times10^{15}$ cm$^{-2}$ and at an energy level of 15 keV to 30 keV (FIG. 6E).

Figure 6F:
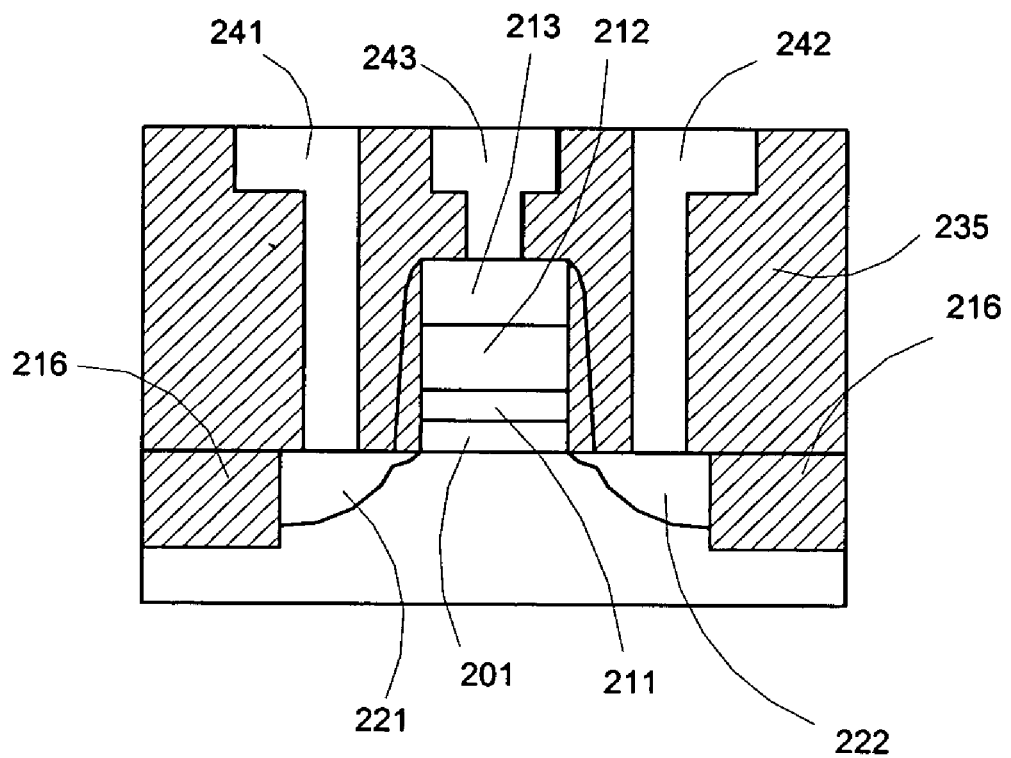

The device fabrication process is then completed with passivation and interconnect metallization steps, FIG. 6F. A passivation layer 235 such as silicon dioxide is deposited on the whole structure to a thickness of about 1000 to 2000 nm. The passivation layer may be planarized to improve the topology of the substrate. The structure is then annealed at a temperature of between about 400° C. to 500° C. for about 15 to 60 minutes. The passivation layer is then patterned, preferably by photolithography, to form contact holes, and then the fabrication process continued with first level metallization contact 241 to source 221, contact 243 to gate stack (top electrode 213, ferroelectric 212, bottom electrode 211 and conductive oxide 201), contact 242 to drain 222.

The gate etching process for the second embodiment of the present invention (the ferroelectric transistor with the gate stack of top electrode/ferroelectric/conductive oxide) is similar to the above gate etching process, with the exception of the omission of the bottom gate electrode steps, meaning no bottom gate electrode deposition and no bottom gate electrode etching.

Alternatively, the ferroelectric gate stack may be fabricated by a replacement gate process similar to Hsu et al., U.S. Pat. No. 6,274,421, entitled "Method of making metal gate sub-micron MOS transistor", hereby incorporated by reference. The fabrication process uses a replacement process to form the gate stack and comprises the steps of:
  Preparing a semiconductor substrate
  Forming a replacement gate stack comprising a sacrificial layer
  Forming drain and source regions on opposite sides of the replacement gate stack
  Filling the areas surrounding the replacement gate stack while exposing a top portion of the replacement gate stack
  Removing the sacrificial layer portion of the replacement gate stack
  Forming the remainder of the gate stack.

The device fabrication process is then completed with passivation and interconnect metallization steps.

Figure 7A:
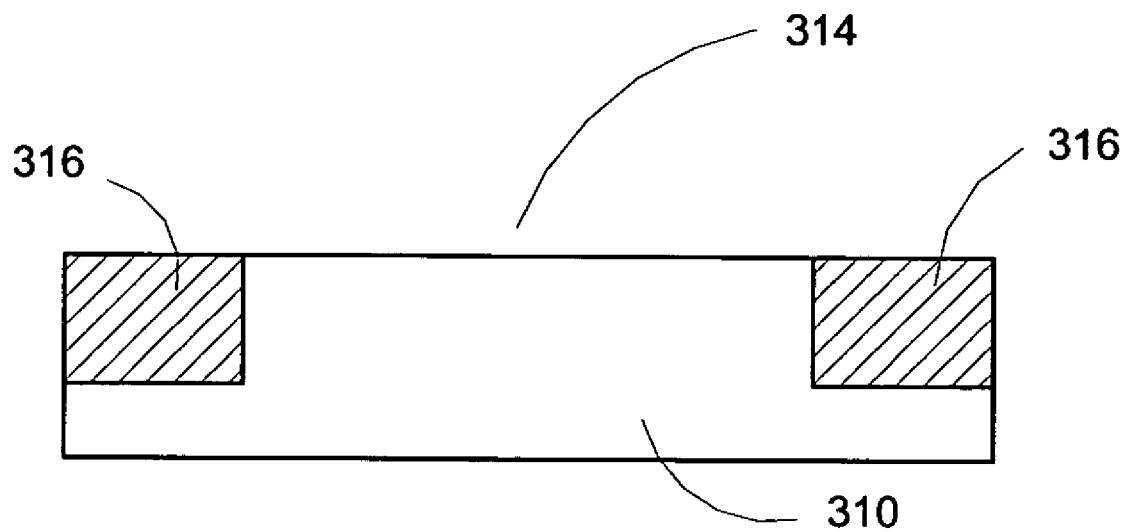
FIGS. 7A-K show a representative fabrication process for replacement gate process.

Preparing a Semiconductor Substrate, FIG. 7A:

Similar to the gate etching process, the fabrication process starts with preparing a substrate (p-type or n-type, bulk or silicon-on-insulator, SOI or SIMOX) and any state of the art suitable processes for the well formation and device isolation. FIG. 7A shows a p-type substrate 310 (similar fabrication process can be applied to an n-type substrate with appropriate corrections and adjustments) and shallow trench isolation (STI) 316 to form an active device 314. For simplicity, important but unrelated details is not shown, such as periphery devices, well formation process and active region threshold voltage adjustment.

Figure 7B:
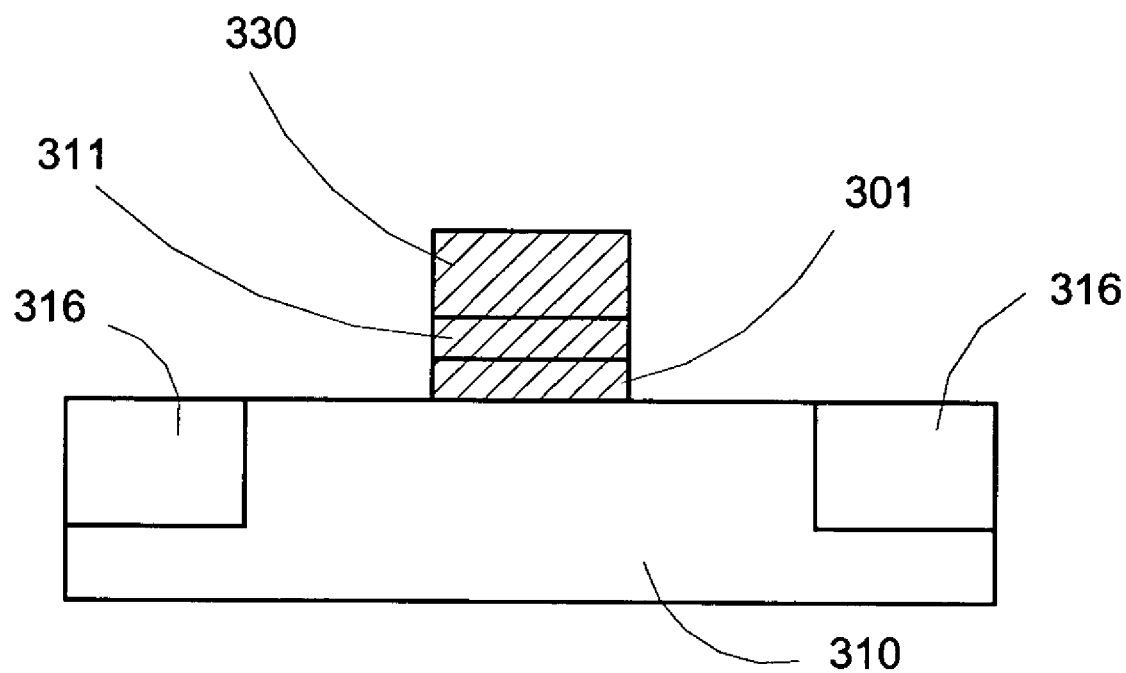

Forming a Replacement Gate Stack Comprising a Sacrificial Layer on the Substrate, FIG. 7B:

Then the multilayer replacement gate stack is deposited. The replacement gate stack serves as a place holder for the continued fabrication of the device, and will be removed before the fabrication of the functional gate stack. Thus the multilayer replacement gate stack comprises the first two layers conductive oxide and bottom electrode of the multilayer gate stack, and a sacrificial gate replacement layer. In the second embodiment of the invention where the bottom electrode of the gate stack is omitted, the replacement gate stack comprises only the conductive oxide layer and the sacrificial gate replacement layer. The conductive oxide is perferably between 10 to 30 nm thick and is preferably $InO_2$ or $RuO_2$, but can be any conductive materials as disclosed above. The bottom electrode is perferably between 50 to 200 nm thick and is perferably platinum or iridium, but also can be any conductive materials as disclosed above. The sacrificial gate replacement layer is preferably between about 100 to 300 nm thick and is preferably silicon nitride or silicon dioxide. Since the sacrificial gate replacement layer serves as a place holder for the functional gate stack, the thickness of the sacrificial layer is partially determined by the total thickness of the remainder of the functional gate stack.

The replacement gate stack multilayer is then patterned into a ferroelectric gate stack, comprising a replacement gate layer 330, a bottom electrode 311, and a conductive oxide 301 as shown in FIG. 7B. The patterning of the gate stack multilayer is preferably by photolithography and reactive ion etching.

Figure 7C:
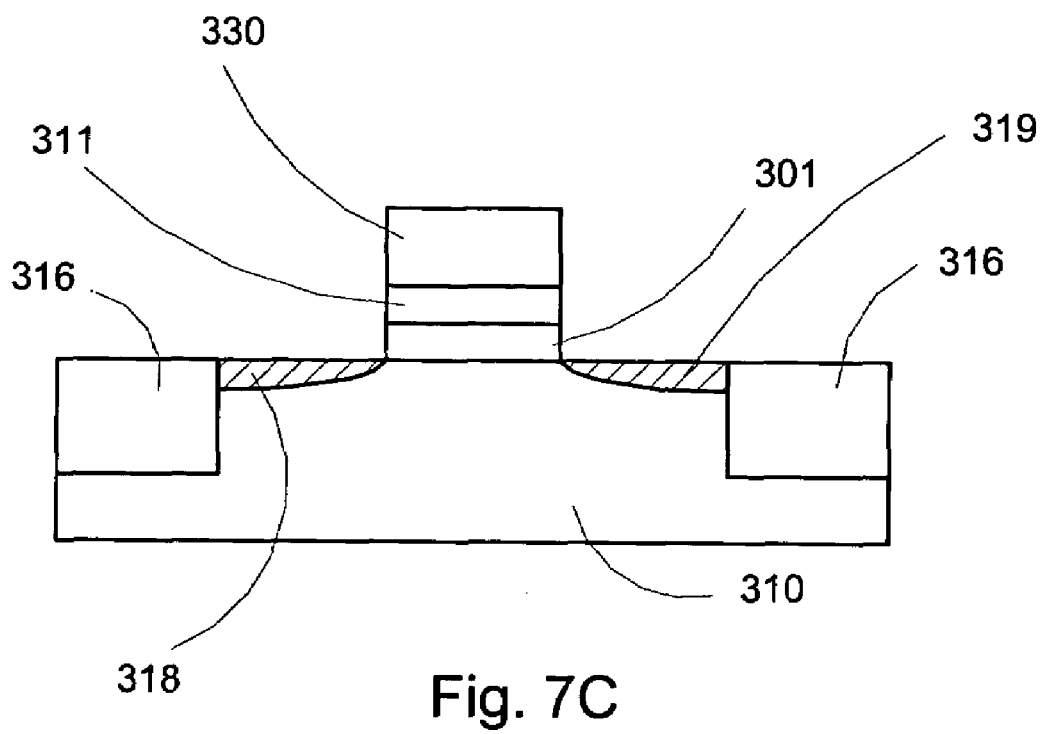

The next step is low doping drain (LDD) ion implantation into source 318 and drain 319 regions, although the ferroelectric memory transistor may or may not requires this LDD ion implantation. LDD implantation includes implantation of phosphorus ions at an energy level of 15 keV to 40 keV, or arsenic ions at an energy level of 30 keV to 60 keV. The doses of the LDD phosphorus or arsenic implantation are about $5\times10^{14}$ cm$^{-2}$ to $10^{15}$ cm$^{-2}$ (FIG. 7C).

Figure 7D:
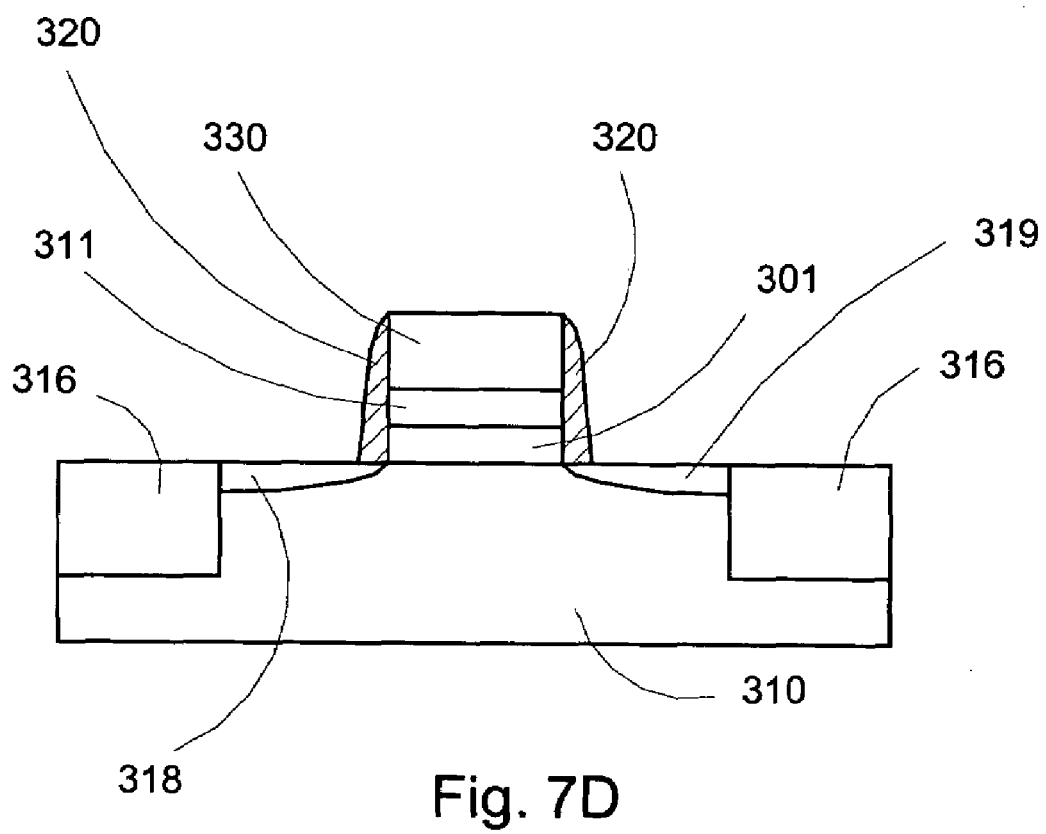

Then a layer of dielectric material such as silicon nitride or silicon dioxide is deposited onto the replacement gate stack to a thickness of about between 20 to 80 nm, and then is anisotropic etched to leave a dielectric sidewall spacer 320 on the ferroelectric gate stack (FIG. 7D).

Figure 7E:
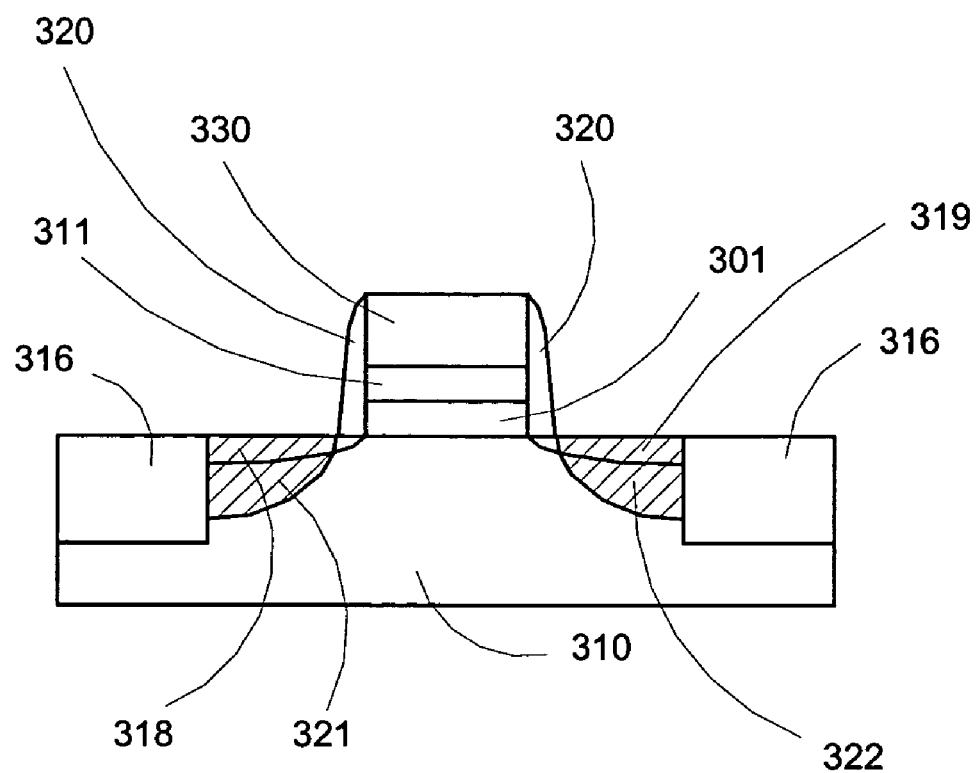

Forming Drain and Source Regions on Opposite Sides of the Replacement Gate Stack, (FIG. 7E):

Then a source region 321 and a drain region 322 are formed by implantation of doping ions, for example arsenic at a dose of about $10^{15}$ cm$^{-2}$ to $5\times10^{15}$ cm$^{-2}$ and at an energy level of 15 keV to 30 keV.

Figure 7F:
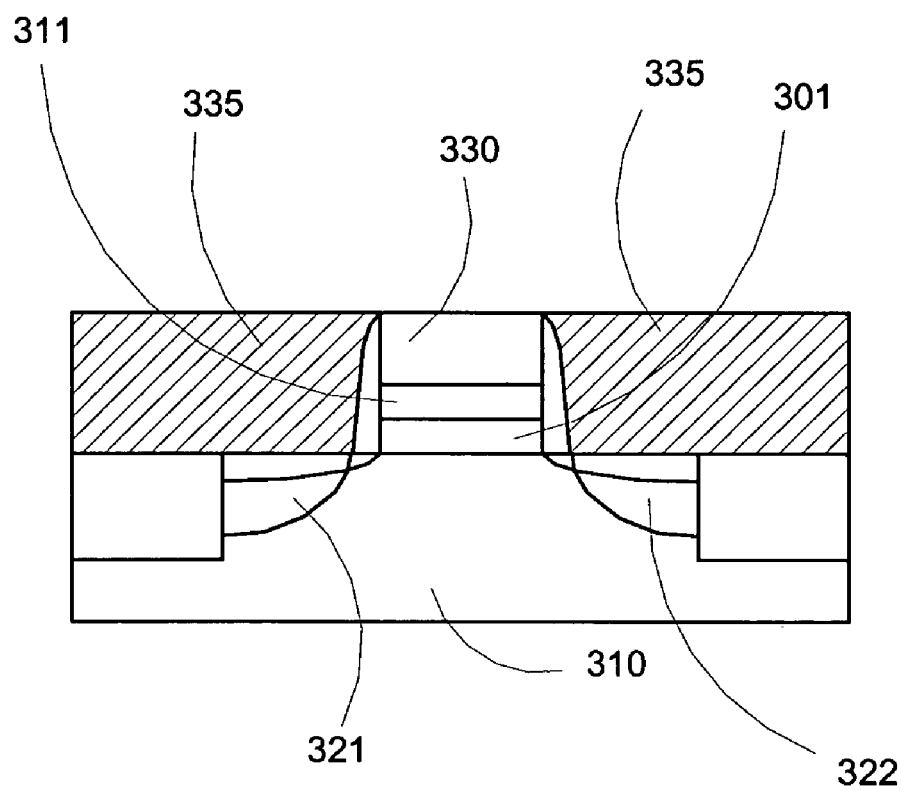

Filling the Areas Surrounding the Replacement Gate Stack While Exposing a Top Portion of the Replacement Gate Stack, FIG. 7F:

A dielectric layer 335 such as silicon dioxide is deposited on the whole structure. The dielectric layer is then planarized, preferably by a chemical mechanical polishing (CMP) process. The thickness of the dielectric layer is preferably about 50% thicker than the replacement gate layer 330 to prevent dishing during planarization.

Figure 7G:
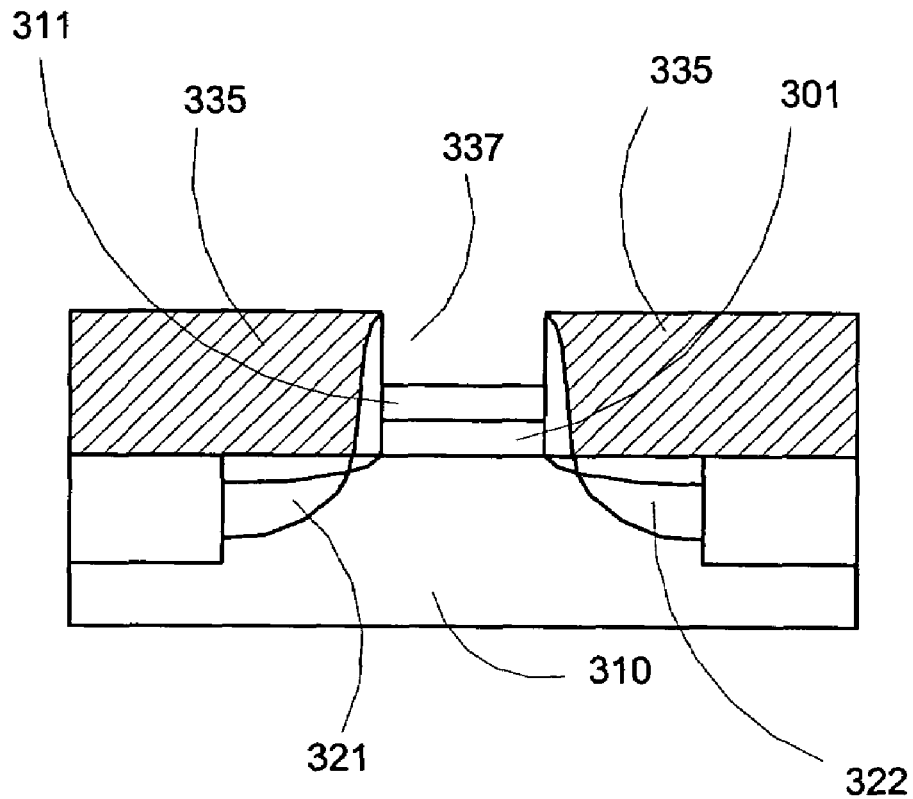

Removing the Sacrificial Layer Portion of the Replacement Gate Stack, FIG. 7G:

The replacement gate layer 330 is removed to expose a gate trench 337, preferably by a wet etch process to prevent damage to the surrounding structure.

Figure 7H:
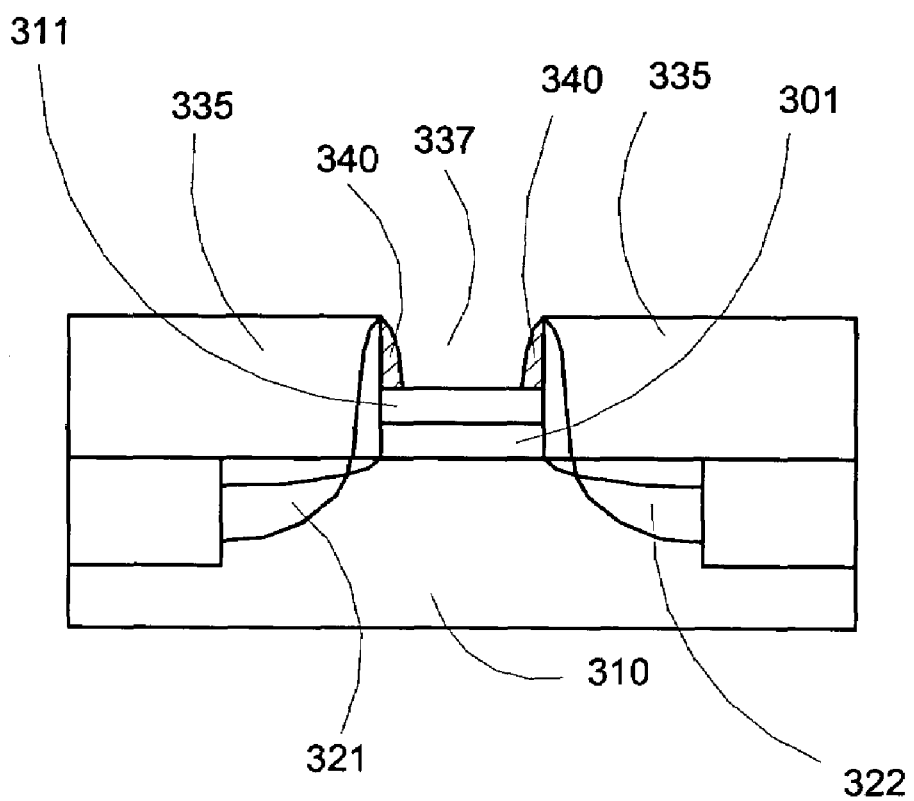

An optional spacer 340 can be formed in the sidewall of the gate trench. The spacer formation is preferably by depositing a layer of silicon nitride of about 10 to 30 nm thick, and then anisotropically etched (FIG. 7H).

Figure 7I:
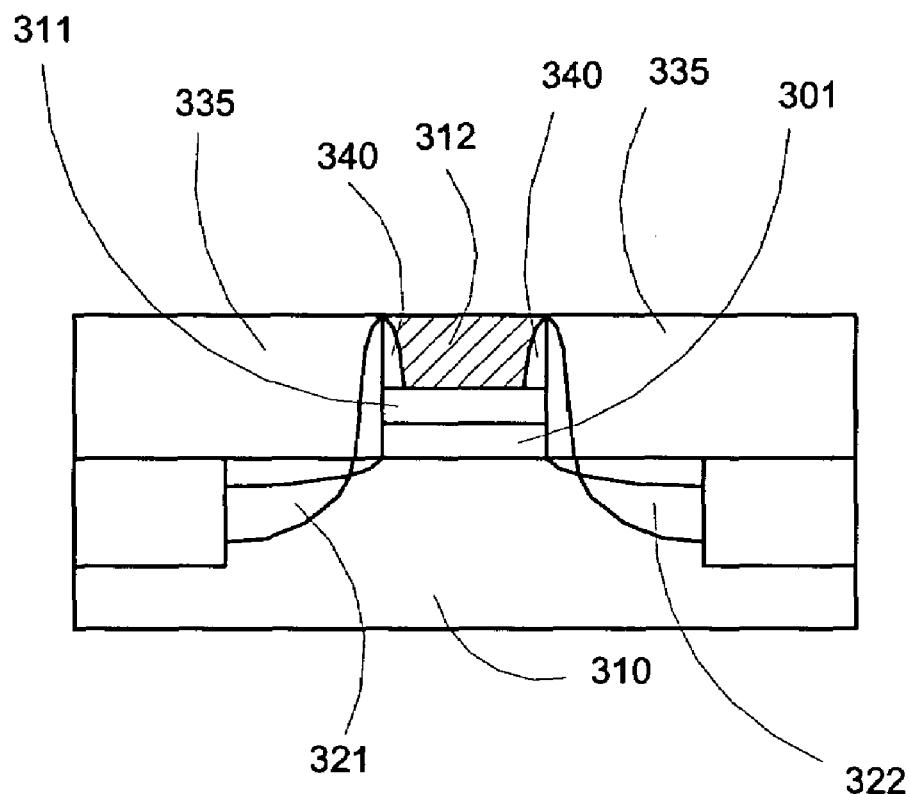

Forming the Remainder of the Gate Stack, FIG. 7I:

The ferroelectric layer is then deposited into the gate trench. The ferroelectric layer is perferably PGO, BST or PZT, but can be any ferroelectric material exhibiting hysteresis effect. The thickness of the ferroelectric layer is preferably slightly thicker than the depth of the gate trench to minimize the dishing effect during the subsequent CMP process of planarize the ferroelectric layer 312.

The top electrode is then fabricated on the feroelectric layer 312. The top electrode formation is preferably by depositing a blanket layer of top eletrode material, and then is patterned into the top electrode, preferably by photo lithography and reactive ion etching techniques. The top electrode is perferably between 50 to 200 nm thick and is perferably aluminum, platinum or iridium, but also can be any conductive materials.

Figure 7J:
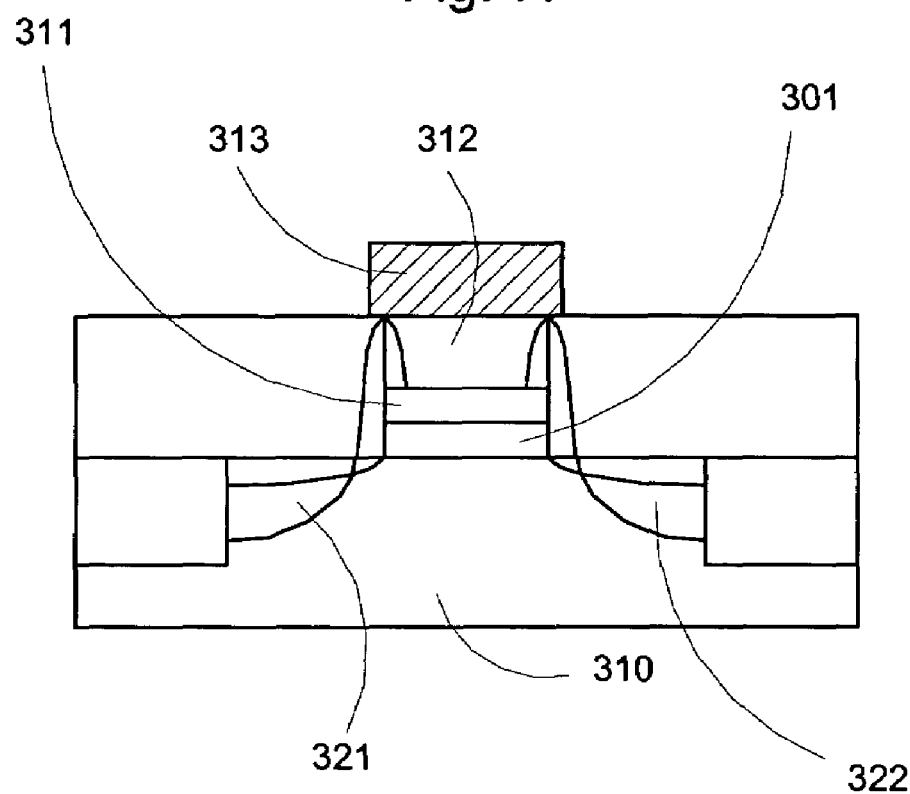
Figure 7K:
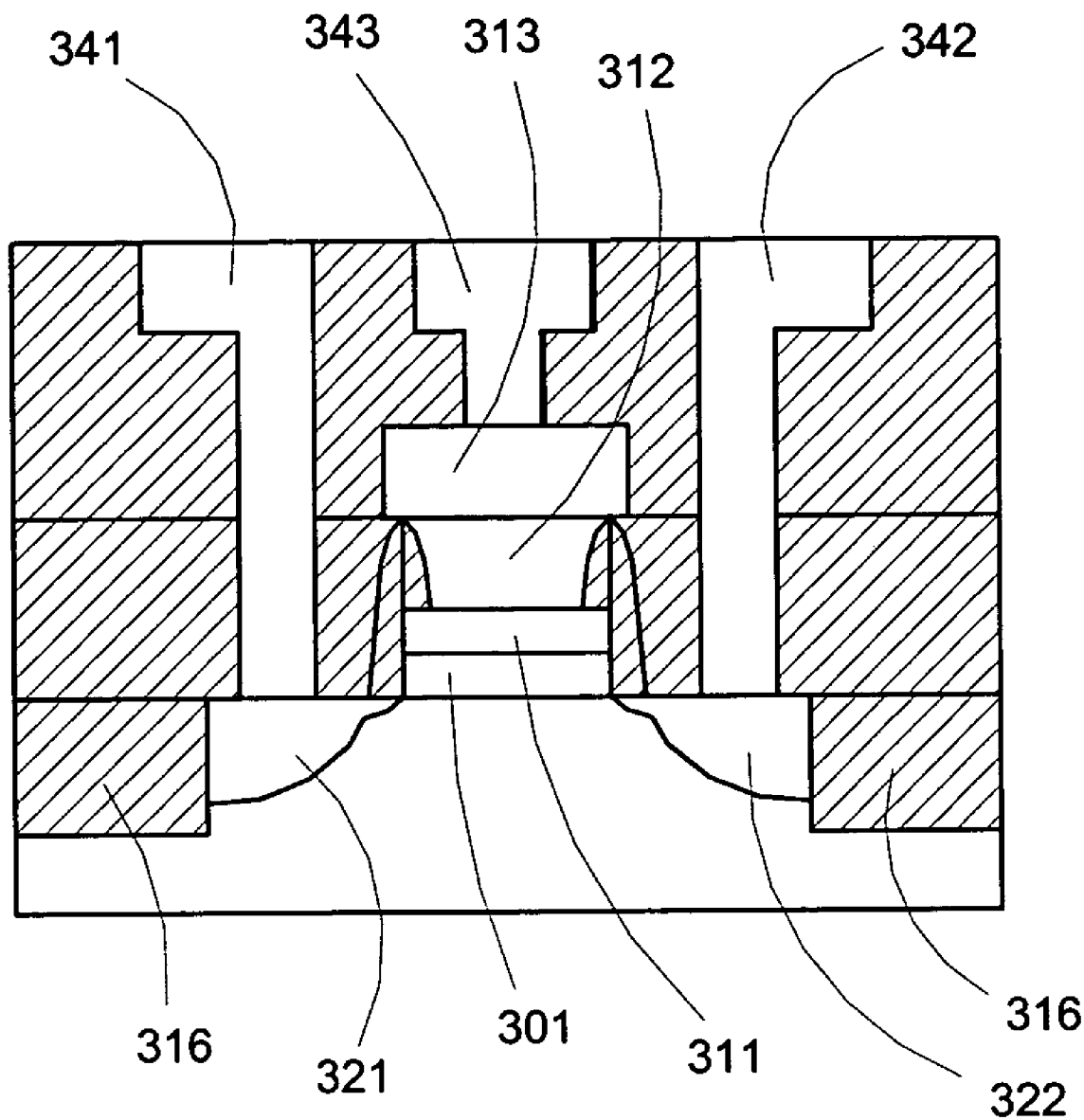

The device fabrication process is then completed with passivation and interconnect metallization steps, FIG. 7J. A passivation layer such as silicon dioxide is deposited on the whole structure to a thickness of about 300 to 500 nm. The structure is then annealed at a temperature of between about 400° C. to 500° C. for about 15 to 60 minutes. The passivation layer is then patterned, preferably by photolithography, to form contact holes, and then the fabrication process continued with first level metallization contact 341 to source 321, contact 343 to gate stack (top electrode 313, ferroelectric 312, bottom electrode 311 and conductive oxide 301), contact 342 to drain 322.

The replacement gate process for the second embodiment of the present invention (the ferroelectric transistor with the gate stack of top electrode/ferroelectric/conductive oxide) is similar to the above replacement process, with the exception of the omission of the bottom gate electrode steps, meaning no bottom gate electrode deposition and no bottom gate electrode etching.

Thus a novel ferroelectric transistor and its memory cell application has been disclosed, together with the method of device fabrication. It will be appreciated that though preferred embodiments of the invention have been disclosed, further variations and modifications thereof may be made within the scope of the invention as defined in the appended claims. Further, although the invention has been described with reference to a ferroelectric transistor for use with nonvolatile memory applications, other applications of the inventive concepts disclosed herein will also be apparent to those skilled in the art.

What is claimed is:

1. A ferroelectric transistor comprising:
source and drain regions provided in a substrate; and
a gate structure on the substrate between the source and drain regions, the gate structure comprising
a conductive oxide layer overlying the substrate selected from the group of materials consisting of:
an oxide of the formula AO$_x$, where A is a material selected from the group consisting of Mo, W, Tc, Rh, Ir, Pd, In, Zn, Sn, Sr—Ru, Nd, Nb, Sm, La, V, and NaCl;
a perovskite oxide of the formula ABO$_3$, where A and B are a combination selected from the group consisting of (A=Ca, Sr)(B=V, Cr, Fe, Ru), (A=La)(B=Ti, Go, Ni, Cu), (A=H, Li, Na, K)(B=Re, Mo, Nb), and (A=La$_{1-x}$Sr$_x$)(B=V, Mn, Co);
a perovskite oxide of the formula A$_2$B$_2$O$_7$, where A and B are a combination selected from the group consisting of (A=Bi, Pd)(B=Ru$_{1-x}$Bi$_x$, Ru$_{1-x}$Pb$_x$);
a layered perovskite oxide selected from the group consisting of CaTiO, Ba$_2$RuO$_4$, and (Sr(Ru, Ir, Cr)O$_3$(SrO)$_N$; and
a high temperature superconducting oxide selected from the group consisting of La$_{1-x}$Sr$_x$CuO$_4$, Nd$_{1-x}$Ce$_x$CuO$_4$, YBa$_2$Cu$_3$O$_7$, Bi$_2$Sr$_2$Ca$_{n-1}$Cu$_n$O$_{2n+4}$, and (Nd$_{1-x}$Ce$_x$)$_2$CuO$_4$;
a ferroelectric material layer overlying the conductive oxide layer, and
a top electrode conductive layer overlying the ferroelectric material layer.

2. A ferroelectric transistor as in claim 1 further comprising a bottom electrode conductive layer between the conductive oxide layer and the ferroelectric material layer.

3. A ferroelectric transistor as in claim 1 wherein the electrode conductive layer is a layer of metal, a layer of conductive oxide or a multilayer of metal and conductive oxide.

4. A method of fabricating a ferroelectric transistor comprising the steps of:
preparing a semiconductor substrate;
forming a gate stack on the substrate, the gate stack comprising
a conductive oxide layer overlying the substrate selected from the group of materials consisting of:
an oxide of the formula AO$_x$, where A is a material selected from the group consisting of Mo, W, Tc, Rh, Ir, Pd, In, Zn, Sn, Sr—Ru, Nd, Nb, Sm, La, V, and NaCl;
a perovskite oxide of the formula ABO$_3$, where A and B are a combination selected from the group consisting of (A=Ca, Sr)(B=V, Cr, Fe, Ru), (A=La)(B=Ti, Co, Ni, Cu), (A=H, Li, Na, K)(B=Re, Mo, Nb), and (A=La$_{1-x}$Sr$_x$)(B=V, Mn, Co);
a perovskite oxide of the formula A$_2$B$_2$O$_7$, where A and B are a combination selected from the group consisting of (A=Bi, Pd)(B=Ru$_{1-x}$Bi$_x$, Ru$_{1-x}$Pb$_x$);
a layered perovskite oxide selected from the group consisting of CaTiO, Ba$_2$RuO$_4$, and (Sr(Ru, Ir, Cr)O$_3$(SrO)$_N$; and a high temperature superconducting oxide selected from the group consisting of $La_{1-x}Sr_xCuO_4$, $Nd_{1-x}Ce_xCuO_4$, $YBa_2Cu_3O_7$, $Bi_2Sr_2Ca_{n-1}Cu_nO_{2n+4}$, and $(Nd_{1-x}Ce_x)_2CuO_4$;

a ferroelectric material layer over the conductive oxide layer; and a top electrode conductive layer over the ferroelectric material layer; and forming drain and source regions on opposite sides of the gate stack.

5. A method as in claim 4 wherein the gate stack further comprises a bottom electrode conductive layer between the conductive oxide layer and the ferroelectric material layer.

6. A method as in claim 4 wherein the formation of the gate stack comprises the deposition of the multilayer gate stack, the photolithography patterning of the gate stack and the etching of the gate stack.

7. A method as in claim 4 wherein the formation of the drain and source regions comprises the implantation to a high doping concentration.

8. A method as in claim 4 further comprising the LDD ion implantation into the source and drain regions.

9. A method as in claim 4 further comprising a dielectric spacer on the sidewall of the gate stack.

10. A method as in claim 4 wherein the electrode conductive layer is a layer of metal, a layer of conductive oxide or a multilayer of metal and conductive oxide.

11. A method of fabricating a ferroelectric memory transistor comprising:

preparing a semiconductor substrate;

forming a replacement gate stack on the substrate, the replacement gate stack comprising a conductive oxide layer overlying the substrate selected from the group of materials consisting of:

an oxide of the formula $AO_x$, where A is a material selected from the group consisting of Mo, W, Tc, Rh, Ir, Pd, In, Zn, Sn, Sr—Ru, Nd, Nb, Sm, La, V, and NaCl;

a perovskite oxide of the formula $ABO_3$, where A and B are a combination selected from the group consisting of (A=Ca, Sr)(B=V, Cr, Fe, Ru), (A=La)(B=Ti, Co, Ni, Cu), (A=H, Li, Na, K)(B=Re, Mo, Nb), and $(A=La_{1-x}Sr_x)(B=V, Mn, Co)$;

a perovskite oxide of the formula $A_2B_2O_7$, where A and B are a combination selected from the group consisting of (A=Bi, Pd)(B=$Ru_{1-x}Bi_x$, $Ru_{1-x}Pb_x$);

a layered perovskite oxide selected from the group consisting of $CaTiO$, $Ba_2RuO_4$, and $(Sr(Ru, Ir, Cr)O_3(SrO)_N$; and a high temperature superconducting oxide selected from the group consisting of $La_{1-x}Sr_xCuO_4$, $Nd_{1-x}Ce_xCuO_4$, $YBa_2Cu_3O_7$, $Bi_2Sr_2Ca_{n-1}Cu_nO_{2n+4}$, and $(Nd_{1-x}Ce_x)_2CuO_4$; and a sacrificial layer over the conductive oxide layer;

forming drain and source regions on opposite sides of the replacement gate stack;

filling the areas surrounding the replacement gate stack while exposing the top portion of the replacement gate stack;

removing the sacrificial layer portion of the replacement gate stack;

forming the remainder of the gate stack, the remainder of the gate stack comprising a ferroelectric material layer over the conductive oxide layer; and a top electrode conductive layer over the ferroelectric material layer.

12. A method as in claim 11 wherein the replacement gate stack further comprises a bottom electrode conductive layer positioned between the conductive oxide layer and the sacrificial layer.

13. A method as in claim 11 wherein the sacrificial layer material comprises silicon nitride or silicon dioxide.

14. A method as in claim 11 wherein the filling of the areas surrounding the replacement gate stack while exposing a top portion of the replacement gate stack comprises the deposition of a dielectric film; and the planarization of the deposited dielectric film to expose the top portion of the replacement gate stack.

15. A method as in claim 11 wherein the formation of the remainder of the gate stack comprises the deposition of the ferroelectric material layer;

the planarization of the ferroelectric material layer;

the deposition of the top electrode conductive layer;

the photolithography patterning of the top electrode conductive layer; and the etching of the top electrode conductive layer.

16. A method as in claim 11 wherein the formation of the replacement gate stack comprises the deposition of the replacement gate stack, the photolithography patterning of the replacement gate stack and the etching of the replacement gate stack.

17. A method as in claim 11 wherein the electrode conductive layer is a layer of metal, a layer of conductive oxide or a multilayer of metal and conductive oxide.

* * * * *

UNITED STATES PATENT AND TRADEMARK OFFICE
CERTIFICATE OF CORRECTION

PATENT NO. : 7,297,602 B2  Page 1 of 1
APPLICATION NO. : 10/659547
DATED : November 20, 2007
INVENTOR(S) : Sheng Teng Hsu and Tingkai Li It is certified that error appears in the above-identified patent and that said Letters Patent is hereby corrected as shown below:

The paragraph beginning at col. 10, line 20, should read as follows:

a perovskite oxide of the formula $ABO_3$, where A and B are a combination selected from the group consisting of (A = Ca, Sr)(B = V, Cr, Fe, Ru), (A = La)(B = Ti, Co, Ni, Cu), (A = H, Li, Na, K)(B = Re, Mo, Nb), and (A = $La_{1-X}Sr_X$)(B = V, Mn, Co);

In col. 10, line 22, of claim 1, the term "Co" has been incorrectly listed as "Go".

Signed and Sealed this

Fifteenth Day of April, 2008

JON W. DUDAS
*Director of the United States Patent and Trademark Office*